US005156988A

United States Patent [19]

Mori et al.

[11] Patent Number: 5,156,988

[45] Date of Patent: Oct. 20, 1992

[54] A METHOD OF MANUFACTURING A QUANTUM INTERFERENCE SEMICONDUCTOR DEVICE

[75] Inventors: Yoshifumi Mori, Chiba; Akira Ishibashi, Kanagawa, both of Japan

[73] Assignee: Sony Corporation, Tokyo, Japan

[21] Appl. No.: 757,605

[22] Filed: Sep. 11, 1991

Related U.S. Application Data

[62] Division of Ser. No. 723,974, Jul. 1, 1991.

[30] Foreign Application Priority Data

Jun. 30, 1991 [JP] Japan .................................. 2-173003

[51] Int. Cl.[5] .......................................... H01L 21/302

[52] U.S. Cl. ...................................... 437/40; 437/203; 437/228; 437/927; 156/644; 156/652

[58] Field of Search ................. 437/203, 228, 927, 67, 437/40, 65, 66; 156/644, 650, 651, 652, 657; 357/5, 27, 55

[56] References Cited

U.S. PATENT DOCUMENTS

| | | | |
|---|---|---|---|
| 4,503,447 | 3/1985 | Iafrate et al. | 437/107 |
| 4,751,194 | 6/1988 | Cibert et al. | 437/24 |
| 4,764,246 | 8/1988 | Bridges et al. | 437/126 |
| 4,783,427 | 11/1988 | Reed et al. | 437/90 |
| 4,883,769 | 11/1989 | Au Gin et al. | 437/110 |

OTHER PUBLICATIONS

Bandyopadhyay, S. et al., "A Novel Quantum Interference Transistor (QUIT) with Extremely Low Power-Delay Product and Very High Transconductance", IEEE IEDM Technical Digest, 1986, pp. 76–79.

*Primary Examiner*—T. N. Quach

*Attorney, Agent, or Firm*—Hill, Van Santen, Steadman & Simpson

[57] ABSTRACT

A method of making a quantum interference semiconductor device comprising the steps of forming a first semiconductor layer on a semi-insulating semiconductor substrate, forming a semi-insulating second semiconductor layer on the first semiconductor layer, forming a metal film so as to form a gate electrode on the second semiconductor layer, forming a first opening by selectively removing the metal film to form the gate electrode, forming a mask on the first opening and etching until midway in the film thickness direction of the semi-insulative second semiconductor layer by anitropic etching through said first opening and subsequently forming an etching until an upper surface of the semiconductor substrate by isotropic etching occurs so as to form a second opening into the semi-insulative second semiconductor layer and the first semiconductor layer which is continuous with the first opening portion and forming a cathode from the first semiconductor layer and a blocker made of the second semiconductor layer.

5 Claims, 4 Drawing Sheets

A METHOD OF MANUFACTURING A QUANTUM INTERFERENCE SEMICONDUCTOR DEVICE

This is a continuation of application Ser. No. 723,974, filed Jul. 1, 1991.

BACKGROUND OF THE INVENTION

1. Field of the Invention

The present invention relates to a quantum interference semiconductor device using an interference effect of electrons and to a method of making such a device and, more particularly, to a quantum interference semiconductor device which can also operate at a room temperature and to a method of making such a device.

2. Description of the Prior Art

In association with the progress of the recent ultrafine structure making technique, studies of a quantum interference device using the interference of electron waves are actively being performed. For instance, as a quantum interference transistor (hereinafter, referred to as an AB effect transistor) using an Aharonov-Bohm effect, a transistor using a double hetero junction of AlGaAs/GaAs as shown in FIG. 1 has been proposed (for example, refer to "Technical Digest of IEDM 86", pp. 76-79). In FIG. 1, reference numeral 101 denotes a GaAs layer; 102 an AlGaAs layer; 103 and 104 $n^+$contacts; and 105 an $n^+$type GaAs layer. In FIG. 1, a wave function of electrons is shown by a broken line.

On the other hand, in recent years, studies of the vacuum microelectronics grow prosperous. As a result of the studies, there is a micro vacuum tube using a semiconductor.

The AB effect transistor as shown in FIG. 1 or other quantum interference devices must be cooled to an ultralow temperature which is equal to or lower than a temperature (4.2 K) of liquid helium in order to hold coherency of electrons. Therefore, it is difficult to easily use them and they are disadvantageous from a viewpoint of costs.

On the other hand, in the conventional micro vacuum tube, the arrival of electrons which are generated from a cathode to an anode is controlled merely by changing a path of the electrons by a gate voltage which is applied to a gate and an interference effect of electrons is not used.

OBJECTS AND SUMMARY OF THE INVENTION

It is, therefore, an object of the invention to provide a quantum interference semiconductor device which can realize an AB effect transistor or other quantum interference devices which can operate even at a room temperature.

Another object of the invention is to provide a method of making a quantum interference semiconductor device which can operate even at a room temperature.

According to an aspect of the invention, there is provided a quantum interference semiconductor device using an interference effect of electron waves, comprising a cathode, an anode, and a gate which are provided in a vacuum, wherein an electron wave emitted from the cathode into the vacuum is divided into a plurality of electron waves and, after that, the plurality of electron waves are joined at the anode and phase differences among the plurality of electron waves are controlled by the gate, thereby making the device operative.

According to another aspect of the invention, there is provided a method of making a quantum interference semiconductor device, comprising the steps of: forming a first semiconductor layer onto a semiinsulative semiconductor substrate; forming a semiinsulative second semiconductor layer onto the first semiconductor layer; forming a metal film to form a gate electrode onto the second semiconductor layer; forming a first opening portion by selectively removing the metal film to form the gate electrode; forming a mask into the first opening portion; performing an etching until a mid-way in a film thickness direction of the semiinsulative second semiconductor layer by an anisotropic etching through the first opening portion and subsequently performing an etching until an upper surface of the semiconductor substrate by an isotropic etching, thereby forming a second opening portion into the semiinsulative second semiconductor layer and the first semiconductor layer so as to be continuous with the first opening portion and also forming a cathode made of the first semiconductor layer and a blocker made of the second semiconductor layer; flattening a surface by filling up the inside of the second opening portion by using a surface flattening material; forming an insulative film onto the whole surface of the substrate; forming a third opening portion by selectively removing a part of the insulative film over the first opening portion; removing the surface flattening material and the mask through the third opening portion; setting the first to third opening portions into a vacuum state by coating a metal film to form an anode onto the insulative film in a vacuum; and selectively removing the metal film so as to leave the metal film on the third opening portion.

A field emission electron source which can generate electrons having a high coherency is preferably used as an electron source. As a field emission electron source, a source which has been epitaxially grown by an unbalanced crystal growing method is preferably used.

Since the device is constructed so that the electrons run in the vacuum, different from the case where the electrons run in a solid, the electrons can ballistically run while keeping the coherency irrespective of a temperature. Therefore, the above semiconductor device can operate at a temperature which is fairly higher than a temperature of liquid helium and can also operate at a room temperature. Consequently, an AB effect transistor and other quantum interference device which can operate even at a room temperature can be realized.

On the other hand, by using a field emission electron source as an electron source for generating electrons, the coherency of the electrons can be raised.

Further, since the field emission electron source formed by the unbalanced crystal growing method is used as an electron source, the field emission electron source in which a radius of curvature of a tip portion is extremely small can be realized. Thus, a voltage which is applied to the electron source to perform the field emission can be reduced.

The above and other objects, features, and advantages of the present invention will become readily apparent from the following detailed description thereof which is to be read in connection with the accompanying drawings.

DETAILED DESCRIPTION OF THE PREFERRED EMBODIMENT

Figure 1:
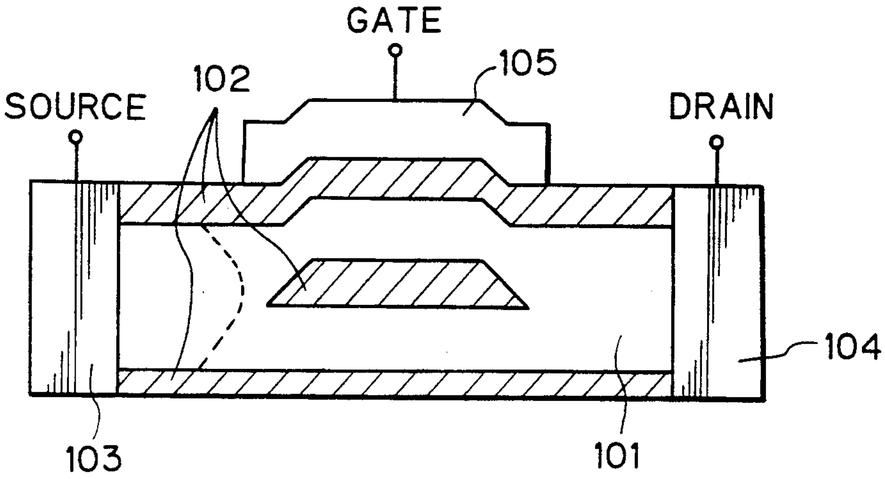
Fig. 1 (PRIOR ART)
FIG. 1 is a cross sectional view showing a structure of a conventional AB effect transistor.
Figure 2:
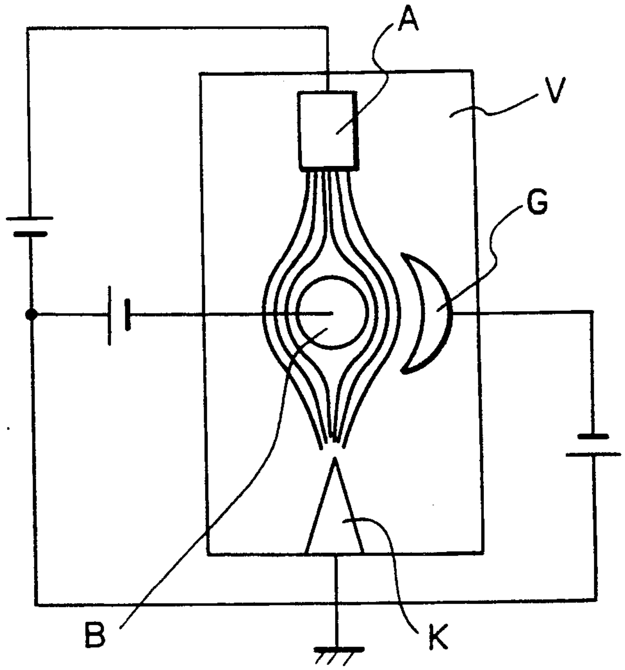
FIG. 2 is a schematic diagram showing a construction of an AB effect transistor according to an embodiment of the invention.

FIG. 2 shows an AB effect transistor according to an embodiment of the invention.

In the following FIGS. 2, 3, and 4A to 4D, the same portions are designated by the same reference numerals.

As shown in FIG. 2, in the AB effect transistor according to the embodiment, a cathode K, an anode A, a gate G, and a blocker B are arranged in a vacuum chamber V of a pressure which is equal to or lower than, for instance, about $10^{-5}$ Torr. A potential of the anode A is set to a positive potential for that of the cathode K. A potential of the blocker B is set to a negative potential for that of the cathode K.

The operation of the AB effect transistor according to the embodiment with the above construction will now be described.

In FIG. 2, electrons having high coherency are emitted from a sharp tip of the cathode K by a field emission. The electron emitted from the cathode K progresses as an electron wave toward the anode A. However, in the way to the anode A, the electron wave is divided by the blocker B into an electron wave which passes on one side of the blocker B (for example, an electron wave which passes on the left side of the blocker B in FIG. 2) and an electron wave which passes on the other side (for instance, an electron wave which passes on the right side of the blocker B in FIG. 2). After that, the electron waves are joined at the anode A. By changing a phase of the electron wave which passes on the right side of the blocker B in FIG. 2 by a gate voltage which is applied to the gate G, the interference of the electron waves which are joined at the anode A is controlled, thereby allowing a transistor operation to be performed.

A phase change $\theta$ of the electron wave by the gate voltage which is applied to the gate G is expressed by $$\theta = \left(\frac{e}{\hbar}\right)^{-1} \int_{\text{gate lower edge}}^{\text{gate upper edge}} V dt$$

where, e: absolute value of an electron charge (unit charge)

ℏ: value which is obtained by dividing a Planck's constant h by $2\pi$ (Dirac's h)

V: gate voltage t: time

Figure 3:
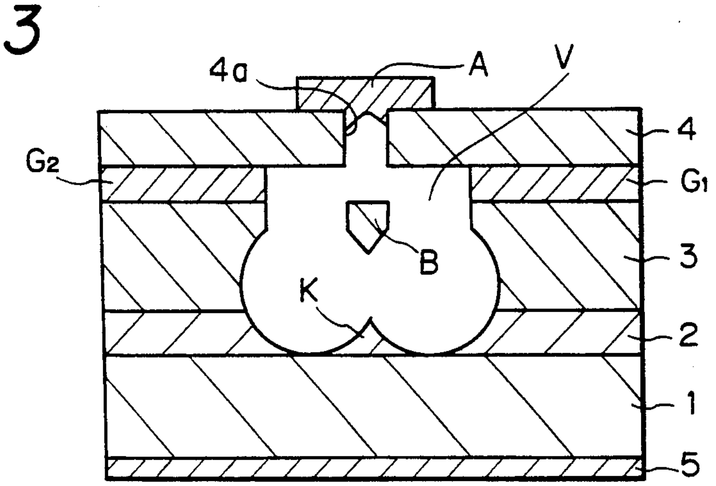
FIG. 3 is a cross sectional view showing a structure of an AB effect transistor according to the embodiment of FIG. 2.

FIG. 3 shows an example of a practical structure of an AB effect transistor according to the embodiment.

As shown in FIG. 3, in the example of the structure, the pointed cathode K made of, for instance, $n^{++}$type GaAs is formed on, e.g., an n type GaAs substrate 1. Reference numeral 2 denotes an $n^{++}$type GaAs layer and 3 indicates, e.g., a semiinsulative GaAs layer A pair of gate electrodes $G_1$ and $G_2$ are formed on the semiinsulative GaAs layer 3 so as to face each other. Different gate voltages can be applied to the gate electrodes $G_1$ and $G_2$, respectively. When the device is actually used, one of the gate electrodes $G_1$ and $G_2$, for example, the gate electrode $G_2$ is connected to the ground and the gate voltage which is applied to the gate electrode $G_1$ is changed.

The blocker B is formed over the cathode K. The blocker B is supported to the semiinsulative GaAs layer 3 at one end or both ends of the blocker B. Reference numeral 4 denotes an insulative film. An opening 4*a* is formed in the portion of the insulative film 4 over the cathode K. The anode A is formed so as to cover the opening 4*a*.

A back contact electrode 5 is formed under a back surface of the n type GaAs substrate 1.

A method of making the AB effect transistor shown in FIG. 3 will now be described.

Figure 4A:
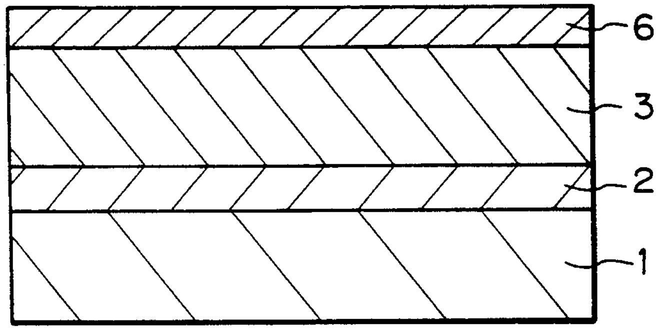
FIGS. 4A to 4D are cross sectional views showing steps of making the AB effect transistor of FIG. 3.

As shown in FIG. 4A, the $n^{++}$type GaAs layer 2, the semiinsulative GaAs layer 3, and a metal film 6 to form the gate electrodes are first sequentially formed on the n type GaAs substrate 1.

Figure 4B:
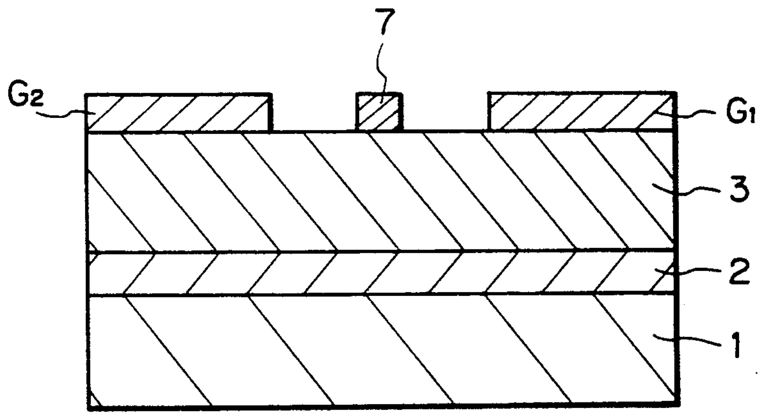

The metal film 6 to form the gate electrodes is patterned by etching, thereby forming the gate electrodes $G_1$ and $G_2$ as shown in FIG. 4B. After that, a mask 7 is formed on the semiinsulative GaAs layer 3 of the portion to form the blocker B.

Figure 4C:
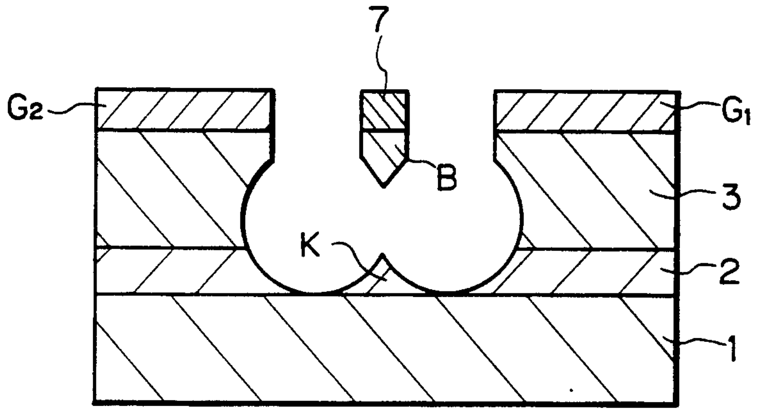

The etching is performed, for instance, until the midway in the thickness direction of the semiinsulative GaAs layer 3 by a reactive ion etching (RIE) method under the condition of the anisotropic etching. After that, the etching is performed until the upper surface of the n type GaAs substrate 1 by the RIE method under the condition of the isotropic etching. Thus, as shown in FIG. 4C, the cathode K made of $n^{++}$type GaAs is formed and the blocker B is formed.

Figure 4D:
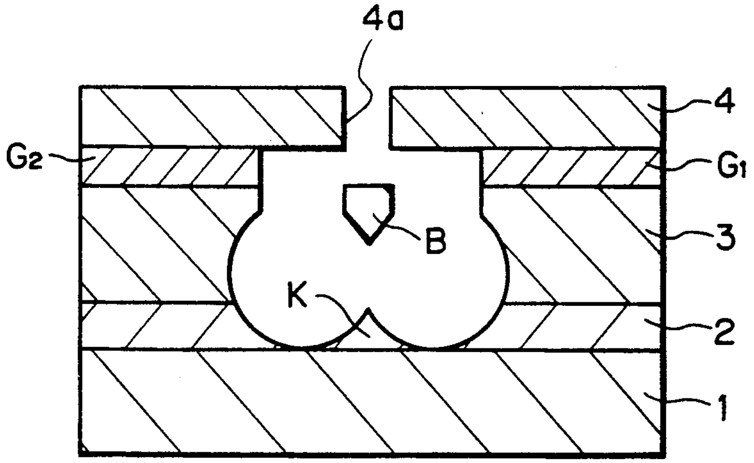

Subsequently, the insides of the openings formed in the $n^{++}$type GaAs layer 2 and the semiinsulative GaAs layer 3 by the above etching are filled up by a material such as insulative material, resist, or the like, thereby flattening the surface. Then, as shown in FIG. 4D, the insulative film 4 is formed on the whole surface by, e.g., a CVD method. After that, a predetermined portion of the insulative film 4 is removed by etching, thereby forming the opening 4*a*. After that, the above surface flattening material is removed through the opening 4*a*.

The metal film is formed on the insulative film 4 in the vacuum by an oblique evaporation depositing method so as to fill up the opening 4*a*. At the same time, a vacuum sealing is executed, so that the vacuum chamber V is formed. The metal film is patterned by etching and the anode A is formed as shown in FIG. 3. After that, the back contact electrode 5 is formed on the back surface of the n type GaAs substrate 1 by, for instance, an evaporation depositing method.

As mentioned above, according to the AB effect transistor according to the embodiment, the cathode K, anode A, gate G, and blocker B are formed in the vacuum chamber V and the electrons emitted from the cathode K ballistically progress in the vacuum while keeping the coherency irrespective of the temperature. Therefore, the AB effect transistor according to the embodiment can operate at a temperature which is fairly higher than that of the conventional transistor and can also operate at a room temperature.

In the AB effect transistor according to the embodiment, since it is sufficient to merely change the phases of electron waves by the gate G, it is sufficient to slightly change the gate voltage which is applied to the gate G, so that the AB effect transistor can operate at a high speed. Further, according to the AB effect transistor of the embodiment, by properly selecting the gate voltage, a transconductance $g_m$ can be set to any one of a positive value and a negative value. Namely, the AB effect transistor according to the embodiment has a performance which is remarkably superior to that of a vacuum tube whose size is merely reduced.

The electron source which is used in the conventional vacuum microelectronics is formed by using an evaporation depositing method of metal or a wet etching. However, a radius of curvature of the tip of the electron source which is formed by the above methods is up to about 500 Å and the tip is not so sharply pointed. Now, assuming that a voltage which is applied to the electron source is set to V and a radius of curvature of the electron source is set to x, an electric field $E_c$ which is necessary for field emission of electrons is expressed by $$E_c \sim \frac{\partial V}{\partial x} = \frac{\delta V}{\delta x}$$

Therefore, when $\delta x$ is large, $\delta V$ also increases. For instance, assuming that $E_c \sim 10^8$V/cm and $\delta x \sim 500$ Å, $$\begin{aligned} \delta V &= E_c \delta x \\ &= 10^8\ (V/\text{cm}) \times 500(\text{Å}) \\ &= 500\ V \end{aligned}$$

Therefore, a method whereby a field emission electron source in which a radius of curvature of the tip is extremely small is formed by using the crystal growth will now be described.

Figure 5:
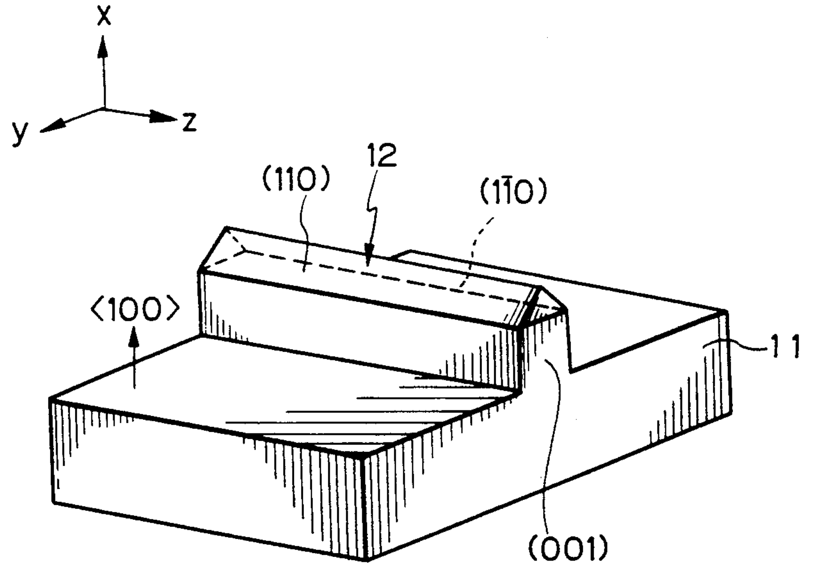
FIG. 5 is a perspective view of a linear field emission electron source.

FIG. 5 shows the case of forming a linear field emission electron source. As shown in FIG. 5, in the example, a linear pattern is formed on a semiinsulative GaAs substrate 11 of, e.g., a (100) face orientation by etching. For example, GaAs is epitaxially grown on the semiinsulative GaAs substrate 11 by an unbalanced crystal growing method such as an organic metal chemical vapor disposition (MOCVD) method. In the epitaxial growth, by properly selecting a material to be grown or the like, the growth can be stopped at a time point when a vertex has been formed in GaAs which grows on the above linear pattern. Thus, a triangular prism-shaped linear field emission electron source 12 is formed on the above linear pattern. In this case, face orientations of both of the oblique surfaces of the triangular prism-shaped field emission electron source 12 are set to (110) and (110) and an angle which is formed by both of the oblique surfaces is set to 90°. In the growth of GaAs by the MOCVD method, a sharp edge point is formed in the case where a ratio of As to Ga in the growing raw material is small. Generally speaking, in the case of the growth of a III–V group compound semiconductor, a sharp edge point is formed when a ratio of the V group element to the III group element in the growing raw material is small.

As mentioned above, according to the example, the shape of the tip portion of the linear field emission electron source 12 is formed as a sharp shape which is defined by the crystal faces and a radius of curvature of the tip can be reduced by about one order of magnitude as compared with that of the conventional one. Therefore, the voltage which is applied to the field emission electron source 12 in order to execute the field emission can be reduced by about one order of magnitude as compared with the conventional one. Consequently, a low electric power consumption can be realized.

Figure 6:
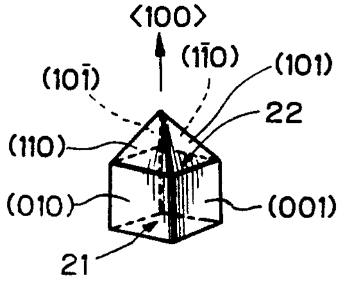
FIG. 6 is a perspective view of a point-shaped field emission electron source.

FIG. 6 shows the case of forming a point-shaped field emission electron source.

As shown in FIG. 6, in the example, a rectangular parallelepiped projecting portion 21 whose side surfaces are constructed by a (001) face, a (010) face, and the like is formed on a semiinsulative GaAs substrate of, for instance, a (100) face orientation (not shown) by etching. For example, GaAs is epitaxially grown on the projecting portion 21 by, e.g., the MOCVD method. Thus, a point-shaped field emission electron source 22 having a pyramid-like shape is formed on the projecting portion 21. In this case, an angle which is formed by a pair of opposite oblique surfaces of the field emission electron source 22 having such a pyramid-like shape is set to 90°.

As mentioned above, according to the above example, the point-shaped field emission electron source 22 in which a radius of curvature of the tip is extremely small can be easily formed by the crystal, growth. Therefore, the voltage which is applied to the field emission electron source 22 in order to execute the field emission of electrons can be reduced.

In the above two examples, the MOCVD method has been used as an unbalanced crystal growing method. However, for instance, a molecular beam epitaxy (MBE) method can be also used.

In Japanese Patent Laid-Open Publication No. Hei 1-294336, there is proposed a method of forming a field emission electron source having a sharp tip by executing a crystal growth by using a seed single crystal which has been controlled to a special orientation by a thermal process. However, such a method is disadvantageous from a viewpoint that it is difficult to control a growing location of a seed single crystal or the like.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For instance, in the above embodiment, the phase of electron wave has been changed by the gate G. However, for example, a magnetic field is applied in the direction perpendicular to the paper surface in FIG. 2 and the phase of electron wave can be also changed by the magnetic field. In the above embodiment, the electron wave emitted from the cathode K has been divided into two electron waves by the blocker B and the paths of the electrons have been doubly connected. However, the paths of the electrons can be also multiply connected by the triply connected or more.

Further, in the structure example of the AB effect transistor according to the above embodiment, although GaAs has been used, for instance, Si can be also used in place of GaAs.

A cold cathode can be also used as an electron source of the AB effect transistor in the above embodiment.

What is claimed is:

1. A method of making a quantum interference semiconductor device, comprising the steps of:

forming a first semiconductor layer onto a semiinsulative semiconductor substrate;

forming a semiinsulative second semiconductor layer onto said first semiconductor layer;

forming a metal film to form a gate electrode onto said second semiconductor layer;

forming a first opening portion by selectively removing the metal film to form the gate electrode;

forming a mask into said first opening portion;

performing an etching until a midway in a film thickness direction of said semiinsulative second semiconductor layer by an anisotropic etching through said first opening portion and subsequently performing an etching until an upper surface of said semiconductor substrate by an isotropic etching occurs, thereby forming a second opening portion into the semiinsulative second semiconductor layer and the first semiconductor layer so as to be continuous with said first opening portion and also forming a cathode made of the first semiconductor layer and a blocker made of the second semiconductor layer;

flattening a surface by filling up the inside of said second opening portion by using a surface flattening material;

forming an insulative film onto the whole surface of the substrate;

forming a third opening portion by selectively removing a part of the insulative film over the first opening portion;

removing said surface flattening material and said mask through said third opening portion;

setting the first to third opening portions into a vacuum state by coating a metal film to form an anode onto the insulative film in a vacuum; and selectively removing said metal film to form an anode so as to leave the metal film on the third opening portion.

2. A method according to claim 1, wherein said semiconductor substrate, said first semiconductor layer, and said second semiconductor layer are made of GaAs.

3. A method according to claim 2, wherein an impurity concentration of the first semiconductor layer is higher than that of the semiconductor substrate.

4. A method according to claim 1, wherein said semiconductor substrate, said first semiconductor layer, said second semiconductor layer are made of silicon.

5. A method according to claim 4, wherein an impurity concentration of the first semiconductor layer is higher than that of the semiconductor substrate.

* * * * *